United States Patent [19]
Yasuda et al.

[11] Patent Number: 5,862,096
[45] Date of Patent: Jan. 19, 1999

[54] SEMICONDUCTOR MEMORY DEVICE HAVING OPTIMALLY ARRANGED INTERNAL DOWN-CONVERTING CIRCUITRY

[75] Inventors: Kenichi Yasuda; Jun Setogawa; Tsukasa Ooishi, all of Hyogo, Japan

[73] Assignee: Mitsubishi Denki Kabushiki Kaisha, Tokyo, Japan

[21] Appl. No.: 904,592

[22] Filed: Aug. 1, 1997

[30] Foreign Application Priority Data

Dec. 26, 1996 [JP] Japan ................................. 8-347664

[51] Int. Cl.⁶ ........................................... G11C 7/00
[52] U.S. Cl. ........................ 365/229; 365/226; 365/227; 365/189.09
[58] Field of Search .................................. 365/229, 226, 365/227, 228, 189.09, 225.7, 189.07; 327/530, 535, 538

[56] References Cited

U.S. PATENT DOCUMENTS

| 5,229,155 | 7/1993 | Arimoto et al. | 365/222 |
| 5,398,207 | 3/1995 | Tsuchida et al. | 365/226 |
| 5,426,615 | 6/1995 | Tomishima et al. | 365/226 |
| 5,592,423 | 1/1997 | Tokami | 365/221 |
| 5,689,460 | 11/1997 | Ooishi | 365/189.07 |

FOREIGN PATENT DOCUMENTS 4-258161  9/1992  Japan .

*Primary Examiner*—David C. Nelms
*Assistant Examiner*—Hien Nguyen
*Attorney, Agent, or Firm*—McDermott, Will & Emery

[57] ABSTRACT

A reference voltage generating circuit and a standby down-converting circuit or a tuning circuit are located in the periphery of the region where a semiconductor device is formed on a semiconductor chip, and a region including an active down-converting circuit which operates during an active cycle or a drive circuit is located adjacent to a circuit actually consuming a current. According to the semiconductor device, increase in area can be suppressed compared to the structure in which both a standby down-converting circuit or drive circuit and the tuning circuit and an active down-converting circuit are located in the vicinity of each current consuming circuit, thereby achieving efficient arrangement of the internal power supply circuitry. As a result, a semiconductor device having efficiently arranged internal power supply circuitry is provided.

20 Claims, 8 Drawing Sheets

SEMICONDUCTOR MEMORY DEVICE HAVING OPTIMALLY ARRANGED INTERNAL DOWN-CONVERTING CIRCUITRY

BACKGROUND OF THE INVENTION

1. Field of the Invention

The present invention relates to semiconductor devices internally including voltage converting circuitry for converting an externally applied power supply voltage to produce an internal operating power supply voltage, and more particularly to a semiconductor memory device having on-chip internal down-converting circuitry for down-converting an external power supply voltage to produce an internal power supply voltage.

2. Description of the Background Art

With higher integration degree of semiconductor devices, transistor elements as the components thereof have been increasingly miniaturized. In order to ensure the reliability of such miniaturized transistor devices and to reduce charge/discharge current on signal lines with a signal amplitude being reduced and thus reduce current consumption, an on-chip voltage converting circuit for lowering an external power supply voltage is sometimes provided to drive internal circuitry with a voltage lower than the external power supply voltage produced by this voltage converting circuit.

The semiconductor devices having such a voltage converting circuit typically include a dynamic random access memory (DRAM). In the case of the DRAM, it is desirable to reduce an operating power supply voltage as much as possible in terms of high-speed operation thereof, device reliability and lower current consumption. However, since a logic gates of a processor for determining a system power supply voltage or the like are lower in integration degree than the DRAM, a power supply voltage of the logic cannot be reduced so low as the operating power supply voltage of the DRAM. In addition, the DRAM must maintain compatibility with the previous generations. Therefore, a higher system power supply voltage is down-converted within the DRAM to produce an internal operating power supply voltage lower than the system power supply voltage, thereby driving internal circuitry of the DRAM.

FIG. 11 is a schematic diagram showing the structure of a conventional internal down-converting circuit generally used in the DRAM. In FIG. 11, internal down-converting circuit VDC includes a reference voltage generating circuit RVG receiving an external power supply voltage VCE applied to an external power supply node EX and a ground voltage for generating a reference voltage Vref at a prescribed voltage level, a comparator CMP for comparing an internal power supply voltage VCI on an internal power supply line IVL with reference voltage Vref, and a current drive transistor DT constituted by a p channel MOS transistor connected between external power supply node EX and internal power supply line IVL and receiving an output signal of comparator CMP at its gate. A load circuit LC operates with the internal power supply voltage VCI on internal power supply line IVL as one operating power supply voltage. An operation of internal down-converting circuit VDC shown in FIG. 11 will now be described.

When internal power supply voltage VCI on internal power supply line IVL is higher than reference voltage Vref, the output signal of comparator CMP attains an H level and therefore conductance of current drive transistor DT is reduced, whereby current supply from external power supply node EX onto internal power supply line IVL is reduced or stopped.

Meanwhile, when internal power supply voltage VCI is lower than reference voltage Vref, the output signal of comparator CMP goes toward an L level and therefore the conductance of current drive transistor DT is increased, whereby current is supplied from external power supply node EX onto internal power supply line IVL, increasing a voltage level of internal power supply voltage VCI. This comparator CMP is normally constituted by a differential amplifier for differentially amplifying the difference between internal power supply voltage VCI and reference voltage Vref. Therefore, this current drive transistor DT supplies a current from external power supply node EX onto internal power supply line IVL in accordance with the difference between internal power supply voltage VCI and reference voltage Vref, whereby internal power supply voltage VCI is held approximately at a reference voltage Vref level.

When load circuit LC operates consuming a current on internal power supply line IVL and internal power supply voltage VCI is reduced, the output signal of comparator CMP is reduced in voltage level and current drive transistor DT supplies large current from external power supply node EX onto external power supply line IVL, restoring this internal power supply voltage VCI to the original level.

With the use of the feedback loop of current drive transistor DT and comparator CMP, internal power supply voltage VCI lower in voltage level than external power supply voltage VCE can be stably produced to operate the internal circuitry (load circuit LC).

Current drive transistor DT serves as resistance component between external power supply node EX and internal power supply line IVL. Accordingly, when load circuit LC operates consuming current on internal power supply line IVL, current drive transistor DT needs to supply a current equal to or higher than consumed current during operation of load circuit LC in order to quickly compensate for reduction in internal power supply voltage VCI resulting from the current consumption of load circuit LC to restore the internal power supply voltage to the original voltage level. Thus, the gate width W (or the ratio W/L of gate width to gate length) of current drive transistor DT is enlarged and current driving capability thereof is sufficiently increased. Therefore, the current drive transistor occupies a relatively large area.

Furthermore, when load circuit LC operates faster and consumes a larger amount of current, a current flowing in internal power supply line IVL is increased. Current consumption I is given by the expression $I = f \cdot Ce \cdot V$, wherein f indicates an operating frequency, Ce a load capacitance to be driven and V a voltage amplitude at an electrode of load capacitance Ce. Accordingly, an average current flowing in internal power supply line IVL is increased with increase in operating frequency.

In this state, if the distance between internal down-converting circuit VDC and load circuit LC is increased and the length of internal power supply line IVL therebetween is thus increased, voltage drop resulting from interconnection line resistance of internal power supply line IVL could not be ignored. This load circuit LC would operate with a voltage lower on the average than internal power supply voltage VCI as one operating power supply voltage and therefore the operational characteristic of load circuit LC cannot be assured, resulting in instability of the circuit operation.

FIG. 12 is a diagram showing another structure of a conventional internal down-converting circuit. This internal down-converting circuit VDC shown in FIG. 12 includes a level shifting circuit LS for shifting in level an internal power supply voltage VCI on an internal power supply line IVL by resistance division. An output voltage LV of level shifting circuit LS is applied to a positive input of a comparator CMP for driving a current drive transistor DT. A reference voltage Vref is applied to a negative input of comparator CMP. Current drive transistor DT and a load circuit LC have the same structure as that shown in FIG. 11.

Level shifting circuit LS includes resistive elements R1, r1, r2 and R2 connected in series between internal power supply line IVL and a ground node, and link elements F1 and F2 respectively connected in parallel with resistive elements r1 and r2 and capable of being blown off. Resistive elements R1 and R2 have a relatively large resistance value in order to reduce current consumption in this level shifting circuit LS.

When link elements F1 and F2 are in a conductive state, resistive elements r1 and r2 are short-circuited, and level shifting circuit LS serves as a resistance dividing circuit formed of resistive elements R1 and R2. At this time, a shift voltage LC given by the following expression is applied to comparator CMP.

$$LV=VCI \cdot R2/(R1+R2)$$

If link element F1 is now blown off, resistive element r1 is connected in series with resistive element R1. Accordingly, in this state, shift voltage LV is given by the following expression.

$$LV=VCI \cdot R2/(R1+R2+r1)$$

More specifically, when link element F1 is blown off, shift voltage LV is reduced in level. Meanwhile, if link element F2 is blown off, resistive element r2 is connected in series with resistive element R2. In this case, shift voltage LV given by the following expression is obtained.

$$LV=VCI \cdot (R2+r2)/(R1+R2)$$

In other words, when link element F2 is blown off, shift voltage LV can be increased in level. Comparator CMP compares this shift voltage LV with reference voltage Vref. Therefore, according to the structure of internal down-converting circuit VDC shown in FIG. 12, feedback control is carried out such that reference voltage Vref and shift voltage LV are at the same voltage level (through operation of comparator CMP and current drive transistor DT).

The voltage level of internal power supply voltage VCI can be adjusted by selectively blowing link elements F1 and F2 off. With the use of this level shifting circuit LS, comparator CMP can operate in the most sensitive region, the feedback loop of comparator CMP and current drive transistor DT can be improved in response characteristic, and internal power supply voltage VCI can be stably held at a prescribed voltage level.

According to the structure of internal down-converting circuit VDC, however, level shifting circuit LS includes link elements F1 and F2. Link elements Fl and F2 occupy a relatively large area (in order to prevent other elements from being short-circuited at the time of blowing off and to prevent other portions from being blown off by mistake at the time of blowing). Therefore, this level shifting circuit LS occupies a large area.

Recently, the operation speed and integration degree of the DRAM have been increasingly improved and therefore such an internal down-converting circuit need be efficiently located so as to prevent both increase in area and voltage drop.

In addition, semiconductor devices including a voltage converting circuit with a function similar to that of such an internal down-converting circuit also have similar problems with improvement in integration degree.

SUMMARY OF THE INVENTION

It is an object of the present invention to provide a semiconductor device including internal down-converting circuitry efficiently located without increase in chip area.

It is another object of the present invention to provide a semiconductor device including internal down-converting circuitry which is located so that a power supply voltage at a fixed voltage level can be stably supplied to each circuit portion without increase in chip area.

A semiconductor device in accordance with a first aspect of the present invention includes a standby down-converting circuit located in the periphery of the semiconductor device region on a chip for always down-converting an external power supply voltage and producing an internal power supply voltage on an internal power supply line, and at least one active down-converting circuit located in a region different from the region where the standby down-converting circuit is located for down-converting an external power supply voltage and producing an internal power supply voltage on an internal power supply line when activated in an active cycle.

A semiconductor device in accordance with a second aspect of the present invention includes a reference voltage generating circuit located in a first region of the periphery of the semiconductor device region on a semiconductor chip for generating a reference voltage, and a plurality of driving circuits located in a second region different from the first region for producing an internal power supply voltage on a corresponding internal power supply line. Each of the plurality of driving circuits includes a variable level shifting circuit for variably shifting in level a voltage on a corresponding internal power supply line, and an internal voltage adjusting circuit for comparing an output voltage of the level shifting circuit with the reference voltage from the reference voltage generating circuit and supplying a current from an external power supply voltage application node to a corresponding internal power supply line in accordance with the comparison result.

In the semiconductor device in accordance with the first aspect, the down-converting circuitry operating both in a standby state and in an active state is located in the periphery having enough space, whereby increase in chip area due to the standby down-converting circuit can be suppressed without affecting the layout of other circuits. In addition, the standby down-converting circuit and the active down-converting circuit are located separately such that the active down-converting circuit is located in the vicinity of a circuit having larger current consumption, whereby an internal power supply voltage can be stably supplied without voltage drop. In other words, an optimal whole layout of the down-converting circuitry can be implemented.

The semiconductor device in accordance with the second aspect includes a reference voltage generating circuit and a tuning circuit which are common to the plurality of driving circuits. The reference voltage generating circuit and the tuning circuit each occupying a relatively large area are located in the periphery having enough space whereby increase in chip area resulting from the tuning circuit and the reference voltage generating circuit can be suppressed. In addition, only the driving circuits are located in the required regions as for the down-converting circuitry, whereby an occupied area of the for down-converting circuit can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
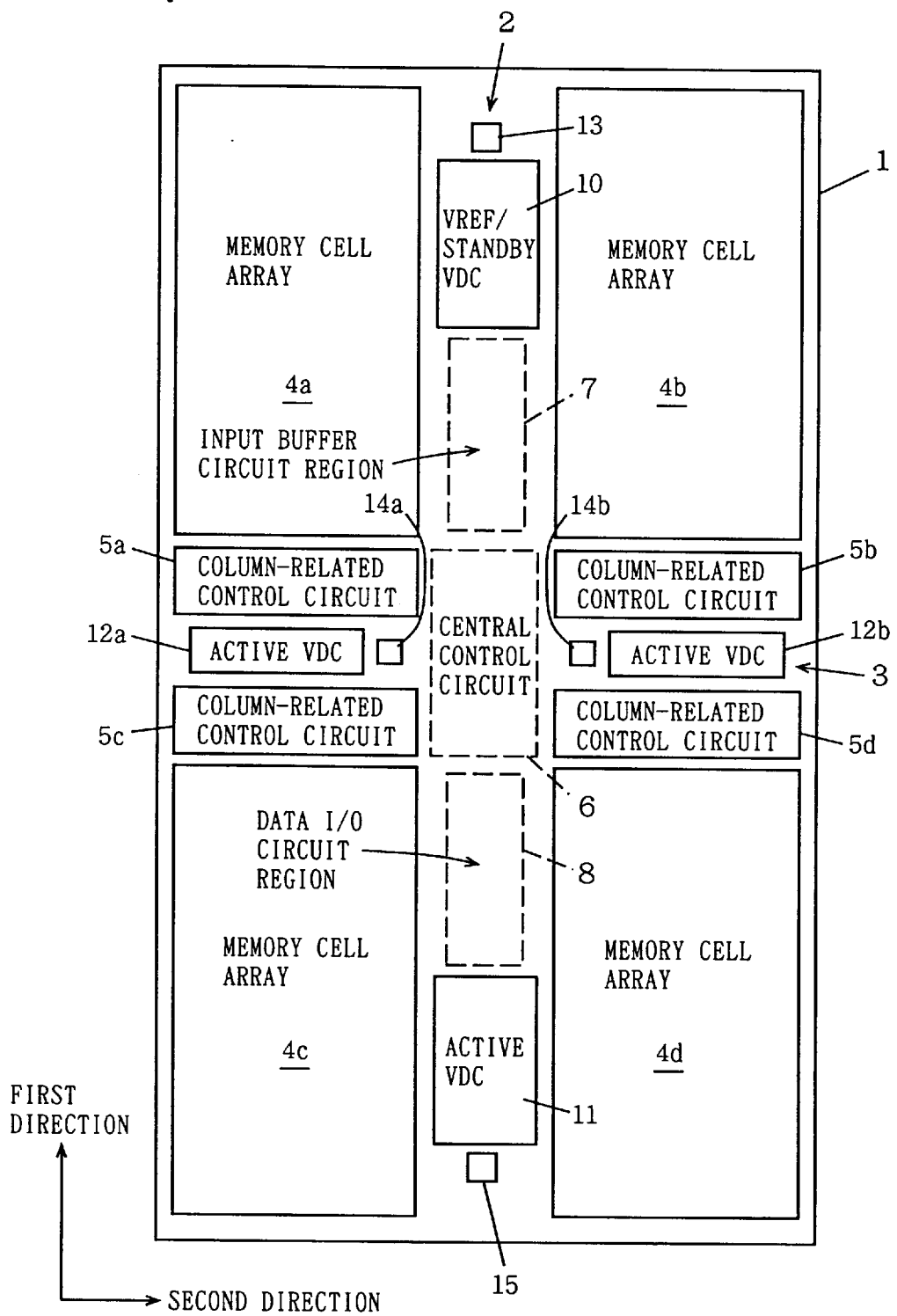
FIG. 1 is a schematic diagram showing an example of a semiconductor device in accordance with a first embodiment of the present invention.

FIG. 1 schematically shows a two-dimensional layout of a semiconductor device in accordance with the first embodiment of the invention. In FIG. 1, the semiconductor device is a semiconductor memory device and is formed on a semiconductor chip 1. Chip 1 includes a first central region 2 located in the middle of the chip with respect to a second direction and extending along a first direction, and a second central region 3 located in the middle of the chip with respect to the first direction and extending in the second direction. First central region 2 and second central region 3 divide semiconductor chip 1 into four regions. Memory cell arrays 4a, 4b, 4c and 4d each having a plurality of memory cells arranged in rows and columns are located in these four regions, respectively. For these memory cell arrays 4a to 4d, column-related control circuits 5a, 5b, 5c and 5d are respectively provided facing second central region 3. Each of column-related circuits 5a to 5d controls an operation (including writing/reading of internal data) relating to column selection in corresponding memory cell array 4a–4d.

In the intersection of first central region 2 and second central region 3 is located a central control circuit region 6 where a central control circuit for generating control signals for controlling of data input/output to and from the external and for selecting row and column in memory cell arrays 4a to 4d in accordance with externally applied control signal and address signal is provided. This central control circuit in region 6 controls both column-related circuits 5a to 5d and row-related control circuits (not shown) provided corresponding to memory cell arrays 4a–4d. Circuits for the arrays are intensively located in central control circuit region 6 in order to control all the arrays. A large amount of interconnections is therefore provided in this region. A chip size is determined from a width necessary for this central portion (an area for the arrays is fixed). Increase in area of the central portion is suppressed as well as chip size is reduced by dispersing down-converting circuits as described in the following.

In first central region 2, an input buffer circuit region 7 is provided adjacent to central control circuit region 6 in a region between memory cell arrays 4a and 4b. A control signal input buffer for receiving an external control signal, an address signal input buffer for receiving an external address signal and the like are located in input buffer circuit region 7. A data I/O circuit region 8 where a data I/O circuit including a read and write circuit for externally outputting data read from memory cell arrays 4a to 4d and producing internal write data from write data externally applied during data write operation is located is provided adjacent to central control circuit region 6 in the portion between memory cell arrays 4c and 4d in first central region 2.

Input buffer circuit region 7, central circuit region 6 and data I/O circuit region 8 are intensively located in the middle of first central region 2. The distance between central control circuit 6 and the input buffer circuit within input buffer circuit region 7 and the distance between central control circuit region 6 and data I/O circuit region 8 are reduced as well as the distance between central control circuit region 6 and each memory cell array 4a–4d is reduced as much as possible. Accordingly, as to first central region 2, not so many circuits necessary for accessing operation are located in the periphery (the region of first central region 2 which is nearer to the chip end than input buffer circuit region 7 and data I/O circuit region 8)of input buffer circuit region 7 and data I/O circuit region 8, leaving enough space. In the following description, the term "periphery" is used to indicate a region which is nearer to the chip end than is a region where a circuit necessary for access in the semiconductor memory device is located, and includes an outer periphery of the chip and a region between pads but does not include a region where the memory cell arrays are formed.

In first central region 2, a VREF/standby VDC region 10 including a reference voltage generating circuit (VREF) for generating a reference voltage Vref and a standby down-converting circuit (VDC) for producing an internal power supply voltage when operating in an standby cycle and an active cycle is provided in the periphery of input buffer circuit region 7. Furthermore, in first central region 2, a region 11 including an active down-converting circuit (VDC) for producing an internal power supply voltage when activated in an active cycle is provided in the periphery of data I/O circuit region 8.

In second central region 3, a region 12a including an active down-converting circuit for producing an internal power supply voltage when activated in an active cycle is provided in the region between column-related control circuits 5a and 5c, and a region 12b including an active down-converting circuit for producing an internal power supply voltage when activated in an active cycle is provided in the region between column-related control circuits 5b and 5d.

Reference voltage Vref from the reference voltage generating circuit included in VREF/standby VDC region 10 is transmitted to the respective active down-converting circuits in active down-converting circuit regions 11, 12a and 12b. During the standby cycle, the standby down-converting circuit in region 10 transmits an internal power supply voltage to each internal power supply line instead of the active down-converting circuits in regions 11, 12a and 12b.

During the standby cycle, the semiconductor memory device is in a precharged state and each signal line has been precharged to a prescribed voltage level (on the assumption that a dynamic random access memory is used). During the standby cycle, the semiconductor memory device consumes only a leak current which is extremely small, and current driving capability of the standby down-converting circuit is made relatively small. In addition, change in level of the internal power supply voltage resulting from the leak current is extremely small, and quick response is not required, whereby the internal power supply voltage can be held at a fixed level even if the standby down-converting circuit is located in the periphery.

Meanwhile, the active down-converting circuits included in regions 12a and 12b supply an internal power supply voltage to column-related control circuits 5a to 5d and column-related circuitry during operation of column-related control circuits 5a, 5c, 5b and 5d. Therefore, since a relatively large amount of current is consumed during their operation, current driving capability of the active down-converting circuits is made sufficiently larger than that of the standby down-converting circuit. The active down-converting circuit in region 11 supplies an internal power supply voltage to a circuit region of data I/O circuit region 8 except an interface circuit portion thereof. Accordingly, current consumption is made relatively large in order to quickly produce internal write data and read data and drive a final output buffer stage, and current driving capability of the active down-converting circuit in region 11 is also made relatively large.

A power supply pad 13 for receiving an external power supply voltage is located between VREF/standby VDC supply region 10 and one end of semiconductor chip 1. A power supply pad 14a for receiving an external power supply voltage is located between active down-converting circuit region 12a and central control circuit region 6, and a power supply pad 14b for receiving an external power supply voltage is provided between active down-converting circuit region 12b and central control circuit region 6. A power supply pad 15 for receiving an external power supply voltage is located between active down-converting circuit region 11 and another end of semiconductor chip 1. The reference voltage generating circuit and the standby down-converting circuit in VREF/standby VDC region 10 utilize a power supply voltage from power supply pad 13. The active down-converting circuit in region 12a utilizes a power supply voltage from power supply pad 14a. The active down-converting circuit in region 12b utilizes a power supply voltage from power supply pad 14b. The active down-converting circuit in region 11 utilizes a voltage from power supply pad 15. Each power supply pad is located near a corresponding down-converting circuit, whereby the distance from each power supply pad to a corresponding internal power supply line is reduced and the distance from each power supply pad to current consuming circuitry is reduced accordingly. As a result, a resistance component of each power supply line can be reduced, achieving suppression in voltage drop.

Figure 2:
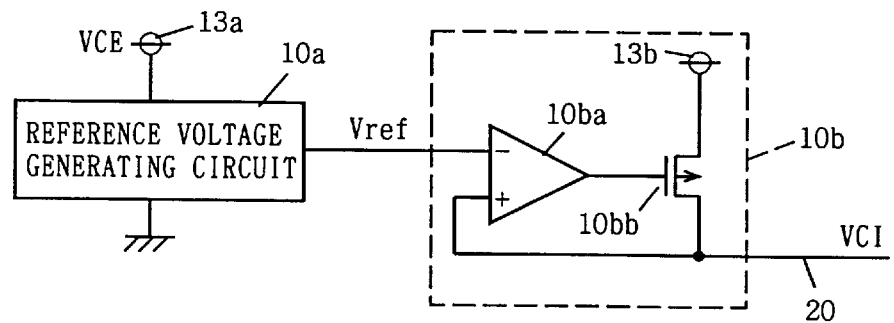
FIG. 2 is a schematic diagram showing the structure of a standby down-converting circuit shown in FIG. 1.

FIG. 2 schematically shows the structure of the reference voltage generating circuit and the standby down-converting circuit included in VREF/standby down converting circuit (VDC) region 10 shown in FIG. 1.

In FIG. 2, reference voltage generating circuit 10a generates reference voltage Vref at a fixed voltage level from both an external power supply voltage VCE on a power supply node 13a connected to power supply pad 13 and a ground voltage.

Standby down-converting circuit 10b includes a comparator 10ba for comparing an internal power supply voltage VCI on an internal power supply line 20 with reference voltage Vref from reference voltage generating circuit 10a, and a current drive transistor 10bb constituted by a p channel MOS transistor for supplying a current from a power supply node 13b to internal power supply line 20 in response to an output signal of comparator 10ba. Power supply node 13b is connected to power supply pad 13.

Comparator 10ba substantially has the structure of a differential amplifier and always operates to compare internal power supply voltage VCI with reference voltage Vref. Standby-down converting circuit 10b merely compensates for reduction in internal power supply voltage VCI resulting from a leak current in each circuit during the standby cycle. In the DRAM, a current during the standby cycle (standby current) is extremely smaller than that during active operation. Therefore, current drive transistor 10bb is adapted to have sufficiently small current driving capability and comparator 10ba is adapted to have a relatively low response speed since internal power supply voltage VCI will not change rapidly during the standby cycle. In other words, a MOS transistor included in comparator 10ba is also adapted to have small current driving capability. Thus, increase in current consumption during operation of the standby down-converting circuit in the standby cycle is suppressed.

Figure 3:
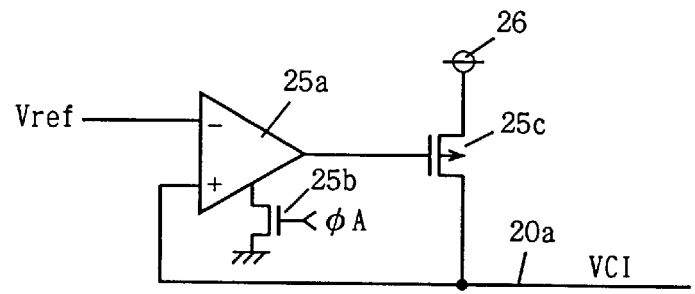
FIG. 3 is a schematic diagram showing the structure of an active down-converting circuit shown in FIG. 1.

FIG. 3 schematically shows the structure of the active down-converting circuits in regions 11, 12a and 12b shown in FIG. 1. In FIG. 3, the active down-converting circuit includes a comparator 25a for comparing internal power supply voltage VCI on an internal power supply line 20a with reference voltage Vref and outputting a signal indicating the comparison result when activated, a current source transistor 25b for activating comparator 25a while forming a current path in comparator 25a when activated in response to an active cycle indication signal φA, and a current drive transistor 25c constituted by a p channel MOS transistor for supplying a current from a power supply node 26 to internal power supply line 20a in accordance with an output signal of comparator 25a.

According to the structure of the active down-converting circuit shown in FIG. 3, when active cycle indication signal φA is inactive (at an L level), current source transistor 25b is in a non-conductive state, whereby comparator 25a is kept in an inactive state with its output signal attaining an H level and current drive transistor 25c remains in a non-conductive state. Accordingly, in this state, a current will not be supplied from power supply node 26 to internal power supply line 20a. Since an operating current flowing over internal power supply line 20a during operation is extremely larger than that during standby, current drive transistor 25c is adapted to have sufficiently large current driving capability.

In addition, in order to prevent rapid reduction in internal power supply voltage VCI resulting from the operating current over internal power supply line 20a, the response speed of comparator 25a is made larger and therefore the size (a gate width or the ratio of gate width to gate length) of a MOS transistor constituting comparator 25a is also made larger. Accordingly, if comparator 25a operates during the standby cycle, current consumption in comparator 25a is large, thereby increasing a standby current. Then, in such a comparator 25a having relatively large current driving capability, a current path from its power supply node to the ground is cut off during the standby cycle, thereby reducing current consumption in the comparator. Activation signal φA is defined by the operation of circuitry consuming a current on internal power supply line 20a.

Figure 4:
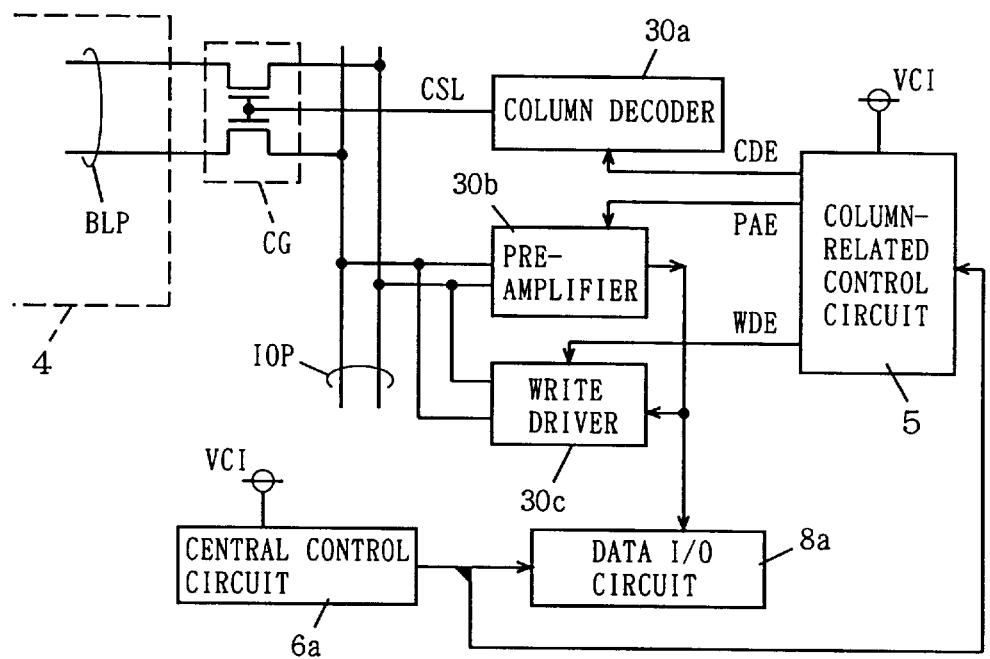
FIG. 4 is a schematic diagram showing the structure of column-related circuitry controlled by a column-related control circuit shown in FIG. 1.

FIG. 4 shows an example of the structure of column-related circuitry. FIG. 4 representatively shows a column-related circuit for a single memory cell array (representatively denoted with the reference numeral 4).

In FIG. 4, the column-related circuit includes a column decoder 30a for decoding a column address signal (not shown) and generating (activating) a column select signal CSL for selecting an addressed column when activated in response to a column decode enable signal CDE from a corresponding column-related control circuit 5 (5a to 5d), a preamplifier 30b for amplifying data on an internal IO bus IOP when activated in response to activation of a preamplifier enable signal PAE from column-related control circuit 5, and a write driver 30c for driving internal IO bus IOP in accordance with data applied from data I/O circuit 8a when activated in response to activation of a write driver enable signal WDE from column-related control circuit 5. Preamplifier 30b and write driver 30c are electrically coupled to data I/O circuit 8a.

In memory array 4, memory cells are arranged in rows and columns and a bit line pair BLP is provided corresponding to each memory cell column. Memory cells of a single column are connected to a single bit line pair BLP. Column select signal CSL from column decoder 30a is applied to a column select gate CG provided in each bit line pair BLP. Column select gate CG is rendered conductive when corresponding column select signal CSL is active, connecting a corresponding bit line pair BLP to internal IO bus IOP. The data input/output timing of data I/O circuit 8a is determined by a control signal from central control circuit 6a.

The column-related circuitry is activated/deactivated in response to activation of a column address strobe signal/CAS in the case of the DRAM. Write driver enable signal WDE, however, is activated when both column address strobe signal/CAS and write enable signal/WE are active.

Therefore, when the active down-converting circuit shown in FIG. 3 is to supply internal power supply voltage VCI to column-related control circuit 5, an inverted signal of column address strobe signal/CAS can be used as active cycle indication signal φA (note that column address strobe signal/CAS is at an L level when being activated).

Instead, an inverted signal of a well-known row address strobe signal /RAS can be used in the case where the active down-converting circuit is to be activated when the DRAM goes into a memory cycle, that is, when the DRAM carries out a row selecting operation. The column-related circuitry is activated after the circuitry (RAS-related circuitry) operating in accordance with row address strobe signal/RAS completes its operation (after a column interlock period has passed). Therefore, although row address strobe signal/RAS may be used as activation indication signal for the active down-converting circuit supplying internal power supply voltage VCI to this column-related control circuit 5, current consumption in comparator 25a is increased during the column interlock period (the period during which a column selecting operation is inhibited) and therefore column address strobe signal/CAS is preferably used as activation indication signal φA.

[Power Supply Line Arrangement 1]

Figure 5:
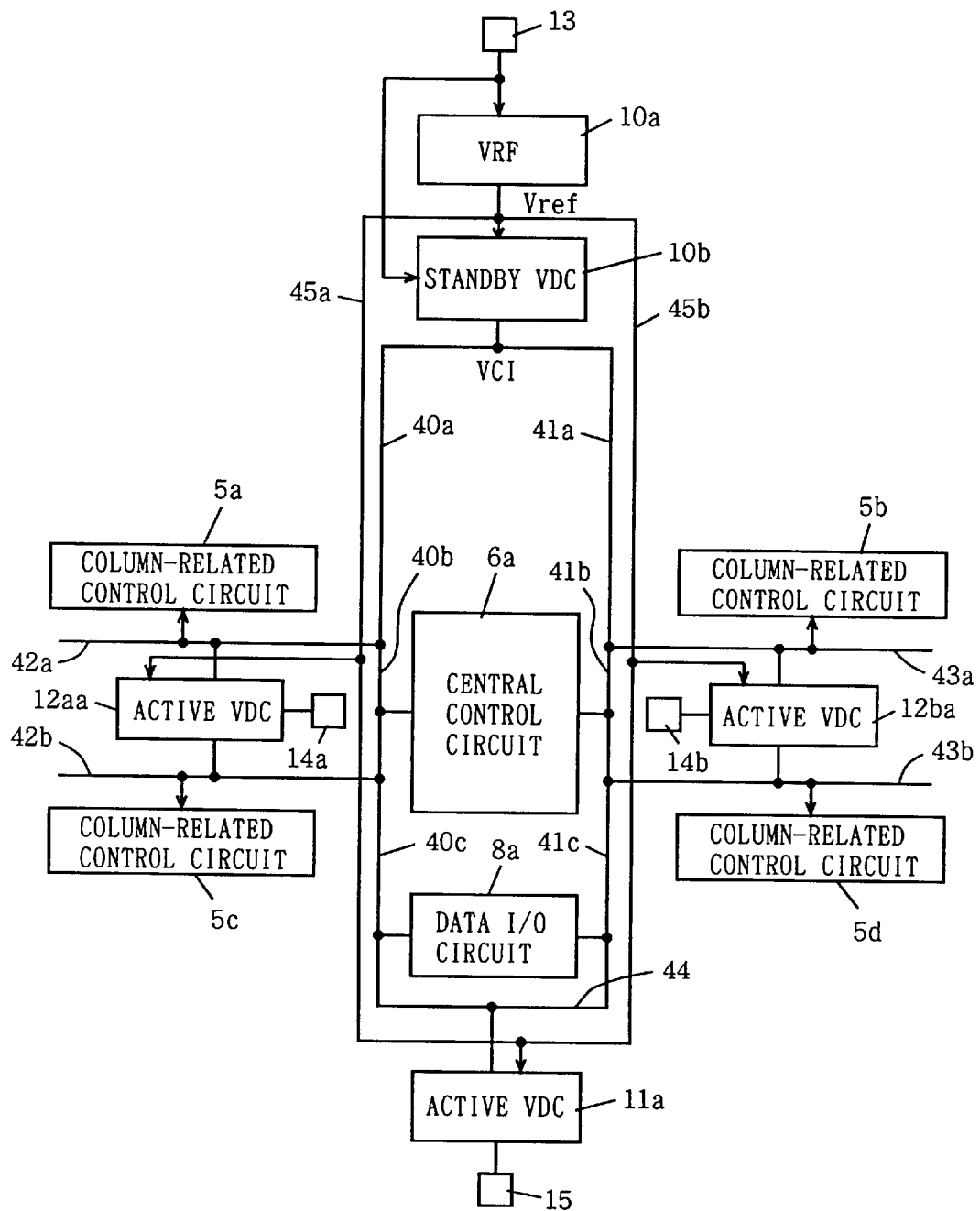
FIG. 5 is a schematic diagram showing an interconnection layout in the first embodiment of the invention.

FIG. 5 schematically shows the arrangement of the internal power supply lines in the first embodiment of the invention. In FIG. 5, reference voltage Vref from reference voltage generating circuit 10a is transmitted through interconnection lines 45a and 45b arranged in a loop in the first central region. Reference voltage Vref is applied from internal interconnection line 45a to active down-converting circuit 12aa (included in region 12a). Reference voltage Vref is applied from internal interconnection line 45b to active down-converting circuit 12ba (included in region 12b). Reference voltage Vref is transmitted through internal interconnection lines 45a and 45b to active down-converting circuit 11a (included in region 11). Reference voltage Vref is transmitted to the farthest active down-converting circuit 11a using both internal interconnection lines 45a and 45b, whereby reference voltage Vref can be stably transmitted to the far active down-converting circuit 11a.

Internal voltage VCI from standby down-converting circuit 10b (included in region 10) is transmitted through internal power supply lines 40a, 40b, 40c, 41c, 41b and 40a arranged in a loop in the first central region surrounding central control circuit 6a and data I/O circuit 8a as is in the case of reference voltage transmitting interconnection lines 45a and 45b. An internal power supply line 42a provided for column-related control circuit 5a is connected to internal power supply lines 40a and 40b. An internal power supply line 43a provided for column-related control circuit 5b is connected to internal power supply lines 41a and 41b. An internal power supply line 42b provided for column-related control circuit 5c is connected to internal power supply lines 40b and 40c. An internal power supply line 43b provided for column-related control circuit 5d is connected to internal power supply lines 41b and 41c. An internal power supply voltage is supplied from active down-converting circuit 11a to an internal power supply line 44 located between internal power supply lines 40c and 41c. Data I/O circuit 8a operates with an internal power supply voltage on internal power supply lines 40c, 41c and 44 as operating power supply voltage.

Active down-converting circuit 12aa supplies an internal power supply voltage to internal power supply lines 42a and 42b. Active down-converting circuit 12ba supplies an internal power supply voltage to internal power supply lines 43a and 43b. Central control circuit 6a operates with a power supply voltage on internal power supply lines 40b and 41b as operating power supply voltage.

If a current on internal power supply lines 40b and 41b is consumed during operation of central control circuit 6a, a current is supplied by active down-converting circuits 12aa and 12ba. An operating power supply voltage for central control circuit 6a is supplied from both sides thereof, that is, from internal power supply lines 40b and 41b, whereby an operating power supply voltage transmission line for central control circuit 6a is reinforced and a power supply voltage is stably supplied to central control circuit 6a. In this case, power supply pads 14a and 14b in particular are located near central control circuit 6a and the distance of an inner power supply line between power supply pads 14a and 14b and circuitry consuming current in central control circuit 6a is short. Thus, a resistance value therebetween is reduced, whereby voltage drop can be sufficiently suppressed and a current can be stably supplied from separate pads 14a and 14b.

For each of column-related control circuits 5a–5d, active down-converting circuits 12aa and 12ba receive a current from power supply pads 14a and 14b located close thereto to produce an internal power supply voltage at a prescribed voltage level on internal power supply lines 42a, 42b and 43a, 43b, respectively. Therefore, the distance between circuitry having current consumption in column-related control circuit 5a–5d and corresponding power supply pad 14a or 14b is also short and resistance of the internal power supply line therebetween can be reduced, whereby an internal power supply voltage at a fixed voltage level can be stably supplied to column-related control circuits 5a to 5d.

Data I/O circuit 8a operates with a power supply voltage on internal power supply lines 40c, 41c and 44 as operating power supply voltage. If the power supply voltage on internal power supply lines 40c, 41c and 44 is changed in response to an operation of data I/O circuit 8a, active down-converting circuit 11a detects this change and restore it to the original power supply voltage level. In this case as well, the distance from power supply pad 15 located near active down-converting circuit 11a to data I/O circuit 8a is short and voltage drop resulting from interconnection resistance in the power supply line can be sufficiently suppressed.

Furthermore, since active down-converting circuits 12aa, 12ba and 11a are located near respective circuit regions. A voltage of an internal power supply line near a corresponding active down-converting circuit would be reduced when a current is consumed during operation of a corresponding circuit.

The active down-converting circuit located near the corresponding circuit responds to the voltage reduction to restore it to the original power supply voltage level. Accordingly, also in the case where internal power supply lines are connected to each other in a loop, an operation of one circuit portion can be restrained from affecting a power supply voltage of another circuit portion. In particular, for column-related control circuits 5a to 5d, internal power supply lines 42a, 42b and 43a, 43b are provided respectively extending from internal power supply lines 40a–40c and 41a–44 arranged in a loop between standby down-converting circuit 10b and active down-converting circuit 11a in the first central region, and a line width of internal power supply lines 40a–40c, 41a–41c and 44 arranged in a loop between standby down-converting circuit 10b and active down-converting circuit 11a is increased, whereby power supply noise on internal power supply lines 42a, 42b, 43a and 43b is absorbed by internal power supply lines 40a–40c, 41a–41c and 44 in a loop with their impedance being sufficiently reduced, preventing power supply noise from being transmitted to another circuit.

In addition, since the power supply pads are located corresponding to active down-converting circuits 12aa, 12ba and 11a, impedance of an external power supply line of each individual active down-converting circuit is extremely reduced and noise generation in the power supply voltage is sufficiently suppressed. Furthermore, even if one active down-converting circuit 12aa, 12ba, 11a causes variation in external power supply voltage, this external power supply voltage noise can be restrained from being transmitted to other active down-converting circuits.

During operation of central control circuit 6a, a current is supplied through internal power supply lines 42a, 426b and 43a, 43b to internal power supply lines 40b and 41b, respectively. In this case, a power supply voltage level on internal power supply lines 42a, 42b, 43a and 43b might vary. In this case, however, column-related control circuits 5a to 5d operate under the control of central control circuit 6a. Thus, since column-related control circuits 5a to 5d operate after an operation of central control circuit 6a, a bad influence of variation in power supply on internal power supply lines 42a, 42b, 43a and 43b resulting from the operation of central control circuit 6a on column-related control circuits 5a to 5d can be ignored. At this time, power supply pads 14a and 14b are located near central control circuit 6a, whereby active down-converting circuits 12aa and 12ba can quickly supply a current to internal power supply lines 40b and 41b without voltage drop and thus can quickly restore a power supply voltage on internal power supply lines 40b and 41b to the original voltage level.

During operation of data I/O circuit 8a, active down-converting circuit 11a detects change in voltage on internal power supply lines 40c and 41c and supplies a current through internal power supply line 44 to internal power supply lines 40c and 41c to restore the voltage thereon to the original voltage level. In this case as well, if the distance between the region where data I/O circuit 8a is located and active down-converting circuits 12aa and 12ba is longer, rapid change in voltage is filtered by RC delay of the internal power supply lines and variation in voltage on internal power supply lines 40a, 40b, 43a and 43b is sufficiently compensated for by active down-converting circuits 12aa and 12ba. Change in voltage on internal power supply lines 40c, 41c and 44 resulting from an operation of data I/O circuit 8a can be sufficiently compensated for before a current responsively supplied from closely located active down-converting circuit 11a adversely affects other circuits, thereby restoring the voltage reliably to the original voltage level.

Accordingly, even if the internal power supply lines are arranged in a loop and the internal power supply lines for the circuits are connected to each other as shown in FIG. 5, an operation of one circuit can be prevented from adversely affecting an internal power supply voltage level for another circuit. In this case, such a problem is particularly solved by sufficiently increasing a width of the internal power supply lines arranged in a loop.

Reference voltage Vref is transmitted to active down-converting circuits 12a, 12b and 11a through internal interconnection line 45a and 45b. In this case, the internal power supply lines and the internal interconnection line for transmitting a reference voltage are formed in separate interconnection layers, whereby reference voltage Vref and internal power supply voltage VCI can be respectively supplied from reference voltage generating circuit 10a and standby down-converting circuit 10b without increase in interconnection occupied area.

[Power Supply Line Arrangement 2]

Figure 6:
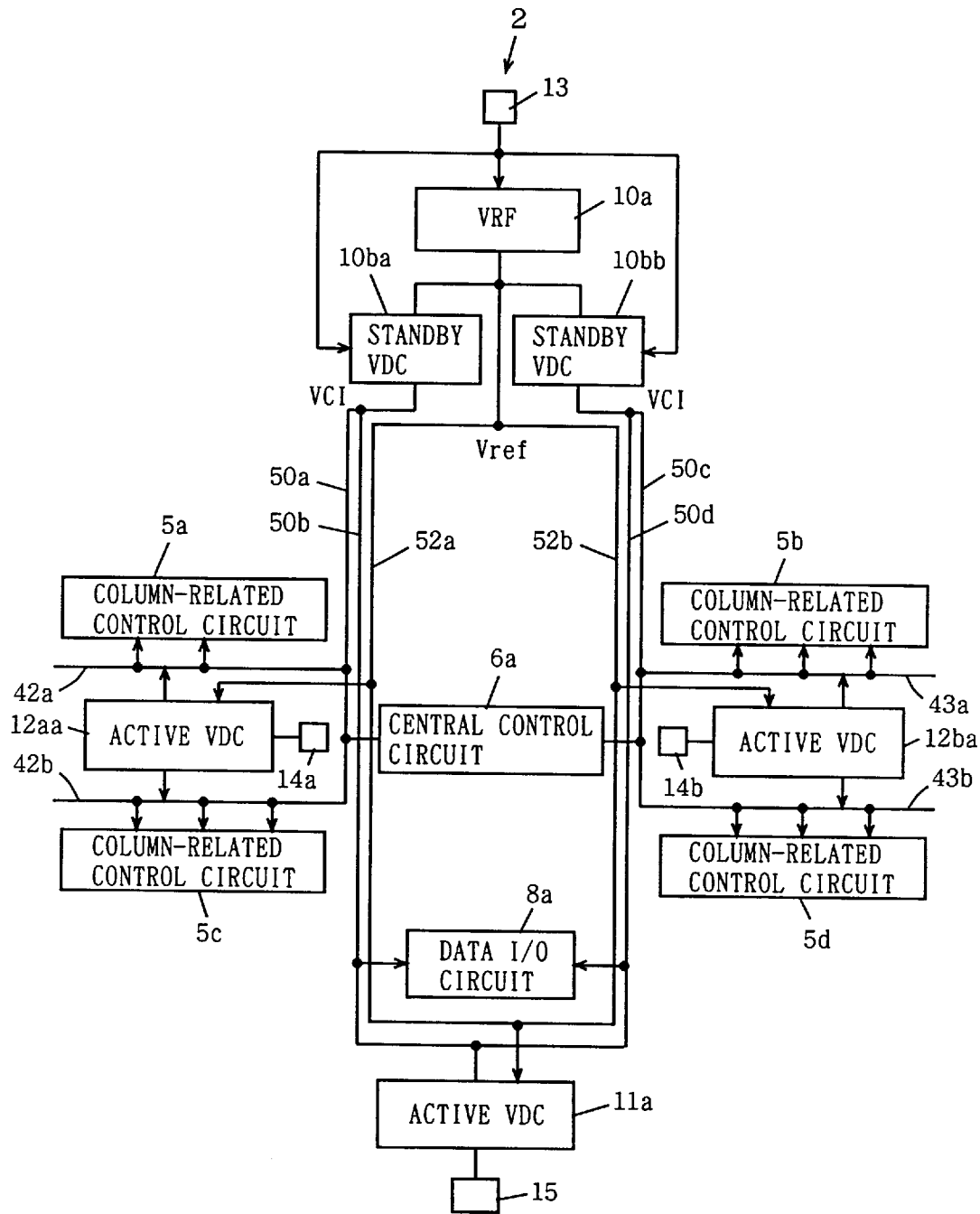
FIG. 6 is a schematic diagram showing an interconnection layout in a modification of the first embodiment of the invention.

FIG. 6 shows a second arrangement of the internal power supply lines of the first embodiment of the invention. According to the structure shown in FIG. 6, two standby down-converting circuits (VDC) 10ba and 10bb are located in the peripheral region of a first central region 2. A reference voltage Vref is supplied in common from a reference voltage generating circuit (VREF) 10a to standby down-converting circuits 10ba and 10bb. An internal power supply voltage VCI from standby down-converting circuit 10ba is transmitted through an internal power supply line 50a to internal power supply lines 42a and 42b provided corresponding to column-related control circuits 5a and 5c. An internal power supply voltage VCI from standby down-converting circuit 10bb is transmitted through an internal power supply line 50c to internal power supply lines 43a and 43b provided corresponding to column-related control circuits 5b and 5d.

An active down-converting circuit 12aa is provided between internal power supply lines 42a and 42b, and a power supply pad 14a is located near active down-converting circuit 12aa. An active down-converting circuit 12ba is provided between internal power supply lines 43a and 43b, and a power supply pad 14b is located near active down-converting circuit 12ba.

A central control circuit 6a receives an internal power supply voltage from internal power supply lines 50a and 50c. In addition, standby down-converting circuits 10ba and 10bb respectively transmit an internal power supply voltage through power supply lines 50b and 50d during a standby period. Internal power supply lines 50b and 50d are connected to each other in the vicinity of active down-converting circuit 11a located on another side of first central region 2. A data I/O circuit 8a receives an internal power supply voltage through internal power supply lines 50b and 50d. Active down-converting circuit 11a supplies a current to power supply lines 50b and 50d during an active cycle to stabilize a power supply voltage for data I/O circuit 8a.

Reference voltage Vref from reference voltage generating circuit 10a is transmitted through interconnection line 52a to active down-converting circuit 12aa and is also transmitted through internal interconnection line 52b to active down-converting circuit 12ba. In addition, reference voltage Vref is transmitted through internal interconnection line 52a and 52b to active down-converting circuit 11a.

According to the arrangement of the power supply lines shown in FIG. 6, standby down-converting circuit 10ba is provided for column-related control circuits 5a and 5c, while standby down-converting circuit 10bb is provided for column-related control circuits 5b and 5d. The internal power supply lines of standby down-converting circuits 10ba and 10bb are made separated from and independent of each other, an operation of column-related control circuits 5a and 5c can be completely prevented from adversely affecting an internal power supply voltage on internal power supply lines 43a and 43b provided for column-related control circuits 5b and 5d. In addition, an internal power supply voltage is transmitted to active down-converting circuit 11a through internal power supply lines 50b and 50d separate from internal power supply lines 50a and 50c, variation in the internal power supply voltage during operation of data I/O circuit 8a can be surely prevented from affecting internal power supply lines 42a, 42b, 43a and 43b of column-related control circuits 5a to 5d. Active down-converting circuit 11a is located farthest from reference voltage generating circuit 10a and standby down-converting circuits 10ba and 10bb. In this case, a voltage is transmitted through two path of internal interconnection, whereby a line width is equivalently increased and therefore the internal power supply voltage and reference voltage can be surely and stably supplied to active down-converting circuit 11a.

In the case of the power supply arrangement shown in FIG. 6, column-related control circuits 5a, 5c, column-related control circuits 5b, 5d and data I/O circuit 8a have separate paths of interconnection for power supply, whereby these circuits can surely and stably operate without being affected by power supply noise.

In addition, standby down-converting circuits 10ba and 10bb are provided separately, whereby column-related control circuits 5a, 5c and column-related control circuits 5b, 5d can operate independent of each other, and an internal power supply voltage can be stably supplied even in a block dividing operation (partial activation) or a bank operation.

As have been described above, according to the first embodiment, the reference voltage generating circuit and the standby down-converting circuitry are located in the periphery having enough space and only the active down-converting circuitry is located in the vicinity of the circuit portion having large current consumption, the layout of the internal power supply circuitry using both the active down-converting circuitry and the standby down-converting circuitry and capable of stably supplying an internal power supply voltage can be implemented without increase in occupied area. In addition, the down-converting circuits are not located in the central portion in common to each array but dispersed, whereby increase in area of the central portion (central control circuit region) can be suppressed and increase in chip size can be suppressed correspondingly. Furthermore, since a reference voltage used for both the standby down-converting circuitry and the active down-converting circuitry is generated by a single reference voltage generating circuit, the overall occupied area of the reference voltage generating circuit can be reduced.

In addition, since the power supply pads are located in the vicinity of the active down-converting circuitry, the distance from the power supply pads to the circuitry with large current consumption located in the vicinity of the active down-converting circuitry is reduced, interconnection line resistance of the internal power supply lines are reduced accordingly, and therefore even if an operating frequency in high speed operation is increased, voltage drop resulting from interconnection line resistance can be surely suppressed even with increase in current consumption.

Furthermore, power supply impedance for each down-converting circuit is reduced, and a current can be quickly supplied from an external power supply pad to a corresponding internal power supply line in accordance with change in internal power supply voltage. In addition, change in external power supply voltage during operation of one down-converting circuit can be prevented from adversely affecting an external power supply voltage for another down-converting circuit.

[Second Embodiment]

Figure 7:
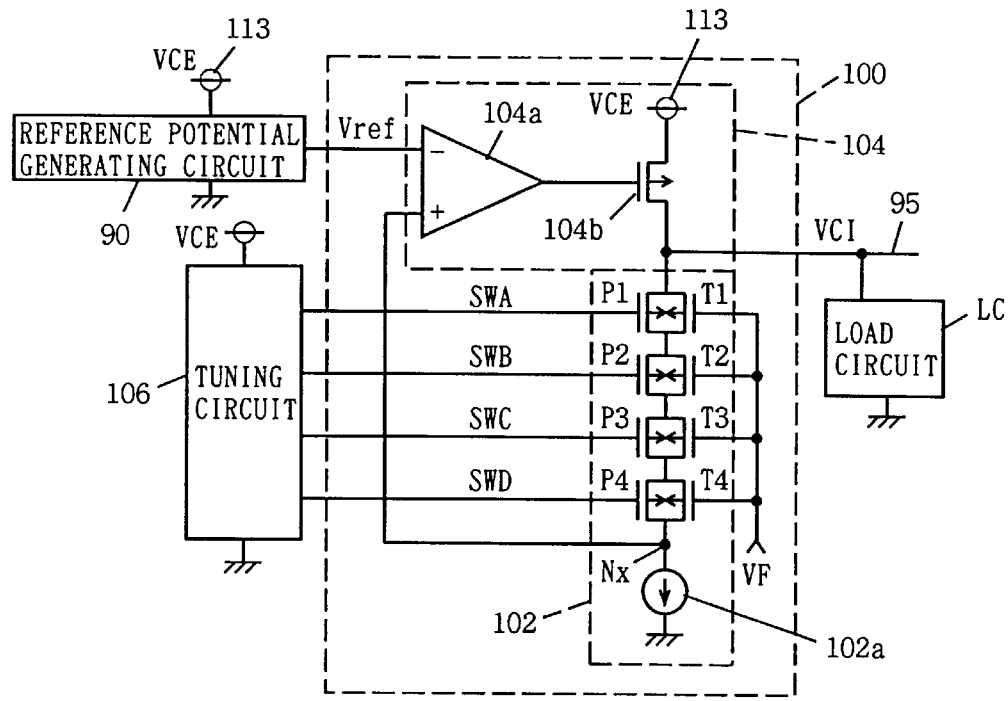
FIG. 7 is a schematic diagram showing the structure of a driving circuit used in a second embodiment of the invention.

FIG. 7 schematically shows the structure of an internal down-converting circuitry used in the second embodiment of the invention. In FIG. 7, the internal down-converting circuitry includes a driving circuit 100 for comparing a voltage corresponding to an internal power supply voltage VCI on an internal power supply line 95 with a reference voltage Vref from a reference voltage generating circuit 90 and supplying a current from an external power supply node 113 to internal power supply line 95 in accordance with the comparison result.

Driving circuit 100 includes a level shifting circuit 102 for shifting in level internal power supply voltage VCI on internal power supply line 95, and an internal voltage adjusting circuit 104 for comparing an output voltage of level shifting circuit 102 with reference voltage Vref and supplying a current from external power supply node 113 to internal power supply line 95 in accordance with the comparison result.

Level shifting circuit 102 includes p channel MOS transistors T1, T2, T3 and T4 connected in series between an output node Nx and internal power supply line 95 and receiving a fixed voltage VF at their gates, p channel MOS transistors P1, P2, P3 and P4 provided in parallel with respective MOS transistors T1 to T4 and receiving respective control signals SWA, SWB, SWC and SWD from a tuning circuit 106 at their gates, and a constant current source 102a connected between output node Nx and a ground node.

Fixed voltage VF is set to an intermediate voltage level or a ground voltage level, and each of p channel MOS transistors T1 to T4 functions as resistive element. In addition, p channel MOS transistors P1 to P4 are selectively rendered conductive in accordance with control signals SWA to SWD from tuning circuit 106 and selectively short-circuit corresponding p channel MOS transistors T1 to T4 (provided in parallel therewith).

Level shifting circuit 102 reduces internal power supply voltage VCI to a voltage at a level determined by a combined resistance of MOS transistors T1 to T4 and P1 to P4 and constant current source 102a. This voltage thus reduced in level is supplied to internal voltage adjusting circuit 104.

Internal voltage adjusting circuit 104 includes a comparator 104a for comparing the output voltage of level shifting circuit 102 with reference voltage Vref, and a current drive transistor 104b constituted by a p channel MOS transistor connected between external power supply node 113 and internal power supply line 95 and receiving an output signal of comparator 104a at its gate. Comparator 104a can be adapted to operate in the most sensitive region thereof by shifting (reducing) internal power supply voltage VCI in level and supplying the resultant voltage thereto.

The level of a voltage V (Nx) appearing on output node Nx of level shifting circuit 102 is given by the following expression, wherein R indicates combined resistance of MOS transistors T1 to T4, and P1 to P4 and I indicates a current across constant current source 102a.

$$V(Nx)=VCI-I \cdot R$$

Internal power supply voltage VCI on internal power supply line 95 is so adjusted in level that reference voltage Vref and voltage V (Nx) output from output node Nx of level shifting circuit 102 are at the same voltage level. More specifically, the relation between internal power supply voltage VCI and reference voltage Vref is given by the following expression.

$$VCI=Vref+I \cdot R$$

Combined resistance value R can be increased by selectively rendering MOS transistors P1 to P4 nonconductive. Therefore, a deviation of internal power supply voltage VCI from a design value level resulting from variation in manufacturing parameter of each semiconductor device can be adjusted by adjusting resistance value R. For example, if MOS transistor P1 is rendered non-conductive and the remaining MOS transistors P2 to P4 are rendered conductive, combined resistance value R will be a resistance value of MOS transistor T1. If all the MOS transistors P1 to P4 are rendered nonconductive, combined resistance value R will be a value obtained by adding resistance values of MOS transistor T1 to T4. MOS transistors P1 to P4 are selectively rendered conductive/non-conductive in accordance with control signals SWA to SWD from tuning circuit 106.

Figure 8A:
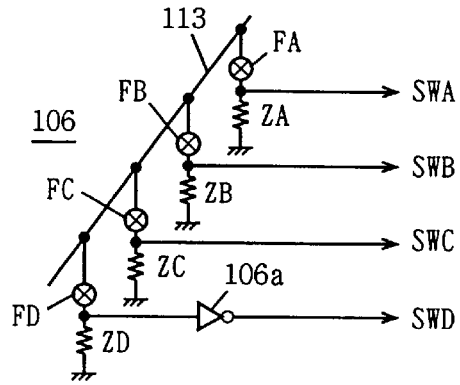
FIG. 8A is a schematic diagram showing an example of the structure of a tuning circuit shown in FIG. 7.

In FIG. 8A shows an example of the structure of tuning circuit 106. In FIG. 8A, tuning circuit 106 includes link elements FA to FD each connected to external power supply node (power supply line 113 and capable of being blown off, and high resistance elements ZA to ZD respectively connected between link elements FA to FD and the ground node. Control signal SWA is output from the connection node between link element FA and resistive element ZA. Control signal SWB is output from the connection node between link element FB and resistive element ZB. Control signal SWC is output from the connection node between link element FC and resistive element ZC. Control signal SWD is output from an inverter 106a receiving a voltage signal from the connection node between link element FD and resistive element ZD.

When fusible link elements FA to FD are all in a conductive state, control signal SWD is at an L level and control signals SWA to SWC are all at an H level. In this state, only MOS transistor P4 shown in FIG. 7 is rendered conductive, while the remaining MOS transistors P1 to P3 are rendered non-conductive. If link element FD is blown, control signal SWD attains an H level, rendering MOS transistor P4 non-conductive. On the contrary, if one of link elements FA to FC is blown, a corresponding one of control signals SWA to SWC falls to an L level, rendering a corresponding one of MOS transistors P1 to P3 of level shifting circuit 102 conductive.

In the initial state, link elements FA to FD are all in a conductive state. In this state, when internal power supply voltage VCI is at a level higher than a prescribed voltage level, link elements FA to FC are selectively blown off by an energy ray such as a laser beam, whereby control signals SWA to SWC are selectively set at an L level and MOS transistors P1 to P3 are selectively rendered conductive. Thus, combined resistance in level shifting circuit 102 is reduced and internal power supply voltage VCI is reduced in level. On the contrary, if internal power supply voltage VCI is at a lower voltage level, link element FD is blown and control signal SWD is set at an H level. Thus, the resistance value of MOS transistor T4 is added, whereby internal power supply voltage VCI is increased in level.

Tuning circuit 106 includes link elements FA to FD which are blown off by an energy ray such as a laser beam, as shown in FIG. 8A. An occupied area of the link elements are relatively large in order to ensure blowing (programming).

Figure 8B:
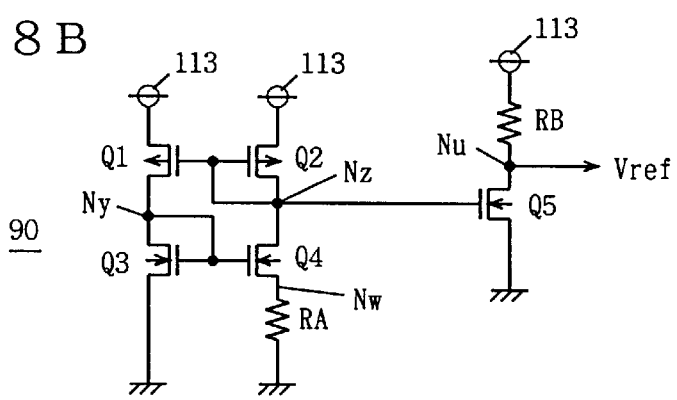
FIG. 8B is a diagram showing an example of the structure of a reference voltage generating circuit shown in FIG. 7.

In FIG. 8B shows an example of the structure of reference voltage generating circuit 90 shown in FIG. 7. The reference voltage generating circuit shown in FIG. 8B has the structure similar to that of the reference voltage generating circuit shown in the first embodiment. In FIG. 8B, reference voltage generating circuit 90 includes a p channel MOS transistor Q1 connected between external power supply node 113 and an internal node Ny and having its gate connected to a node Nz, a p channel MOS transistor Q2 connected between external power supply node 113 and internal node Nz and having its gate connected to node Nz, an n channel MOS transistor Q3 connected between internal node Ny and a ground node and having its gate connected to internal node Ny, an n channel MOS transistor Q4 connected between internal node Nz and a node Nw and having its gate connected to node Ny, and a resistive element RA connected between node Nw and the ground node. MOS transistors Q1 to Q4 and resistive element RA together function as a constant current generating circuit.

Reference voltage generating circuit 90 further includes a resistive element RB connected between external power supply node 113 and an output node Nu and an n channel MOS transistor Q5 connected between node Nu and the ground node and having its gate connected to node Nz. Resistive element RB and MOS transistor Q5 together function as a constant voltage generating circuit. An operation of the circuit shown in FIG. 8B will now be described briefly.

When a voltage level at power supply node 113 is increased, MOS transistors Q1 and Q2 are rendered conductive to supply currents to nodes Ny and Nz. A voltage level at node Ny is increased by power on, and MOS transistor Q3 is rendered conductive. When the voltage level at node Ny becomes higher than that at node Nw at least by a threshold voltage level of MOS transistor Q4, MOS transistor Q4 is rendered conductive. MOS transistors Q2 and Q1 together form a current mirror circuit and therefore a current having the same magnitude as that of the current flowing through MOS transistor Q2 flows through MOS transistor Q1 (assuming that MOS transistors Q1 and Q2 have the same size).

Meanwhile, the gate and drain of MOS transistor Q3 is connected to the gate of MOS transistor Q4, and a mirror current of the current flowing through MOS transistor Q3 flows through MOS transistor Q4. MOS transistor Q3 has its source connected to the ground node, while MOS transistor Q4 has its source connected to node Nw. Therefore, when a current having the same magnitude flows through MOS transistor Q3 and Q4, a voltage level at node Nz becomes higher than that at node Ny by a voltage level at node Nw (MOS transistor Q3 operates in a saturated region, while MOS transistor Q4 operates in an nonsaturated region).

When a current flowing through MOS transistors Q2 and Q4 increases, a voltage level at node Nw rises due to resistive element RA. Meanwhile, the current flowing through MOS transistor Q2 also increases, but MOS transistor Q3 operates in a saturated region and rise in voltage level at node Ny is smaller than that at node Nw resulting from increase in current flowing through resistive element RA, whereby the current flowing through MOS transistor Q4 is reduced. The current flowing through MOS transistors Q2, Q1 and Q3 reduces accordingly. On the contrary, when the current flowing through MOS transistors Q2 and Q4 reduces, the current flowing through MOS transistors Q1 and Q3 reduces and a voltage level at node Ny lowers. This lowering in voltage level at node Ny is smaller than that at node Nw, and a larger current flows through MOS transistor Q4 with its conductance being increased.

On the contrary, when the current flowing through MOS transistors Q1 and Q3 increases, a voltage level at node Ny rises. Thus, a large current flows also through MOS transistor Q4, but a current flowing through resistive element RA increases and a voltage level at node Nw rises, suppressing increase in current flowing through MOS transistor Q4. The current flowing through MOS transistor Q4 is supplied through MOS transistor Q2. Therefore, when the current flowing through MOS transistor Q1 increases, the increase in current is stopped by MOS transistor Q2. On the contrary, when the current flowing through MOS transistors Q1 and Q3 decreases, a voltage level at node Ny lowers, the current flowing through MOS transistor Q4 decreases accordingly and a voltage level at node Nw lowers. In accordance with the fall in voltage at node Nw, the conductance of MOS transistor Q4 is increased and the current flowing through MOS transistor Q2 is increased. Therefore, with current mirror stages of MOS transistors Q1 and Q2 and of MOS transistors Q3 and Q4, a current with a constant magnitude stably flows through MOS transistors Q1 to Q4. In the stable state of the constant current generating stage, the difference in voltage between nodes Nz and Ny is equal to the voltage across resistive element RA. Accordingly, a voltage level at node Nz is constant.

MOS transistor Q5 receiving a voltage at node Nz at its gate functions as a constant current source and extracts a constant current from resistive element RB. Accordingly, reference voltage Vref is at a voltage level equal to that of the difference between external power supply voltage VCE and a voltage across resistive element RB.

Note that the number of resistance value-adjusting transistor elements is not limited to four, and any number of transistor elements may be used.

In addition, in reference voltage generating circuit 90 shown in FIG. 8B, MOS transistor Q5 in the output stage may be constituted by a p channel MOS transistor. Furthermore, the reference voltage generating circuit may be structured such that p channel MOS transistor for the transistor Q5 is connected to power supply node 113 and a resistive element is connected between this MOS transistor and the ground node. In this case, reference voltage Vref is at a fixed voltage level which is independent of an external power supply voltage.

Figure 9:
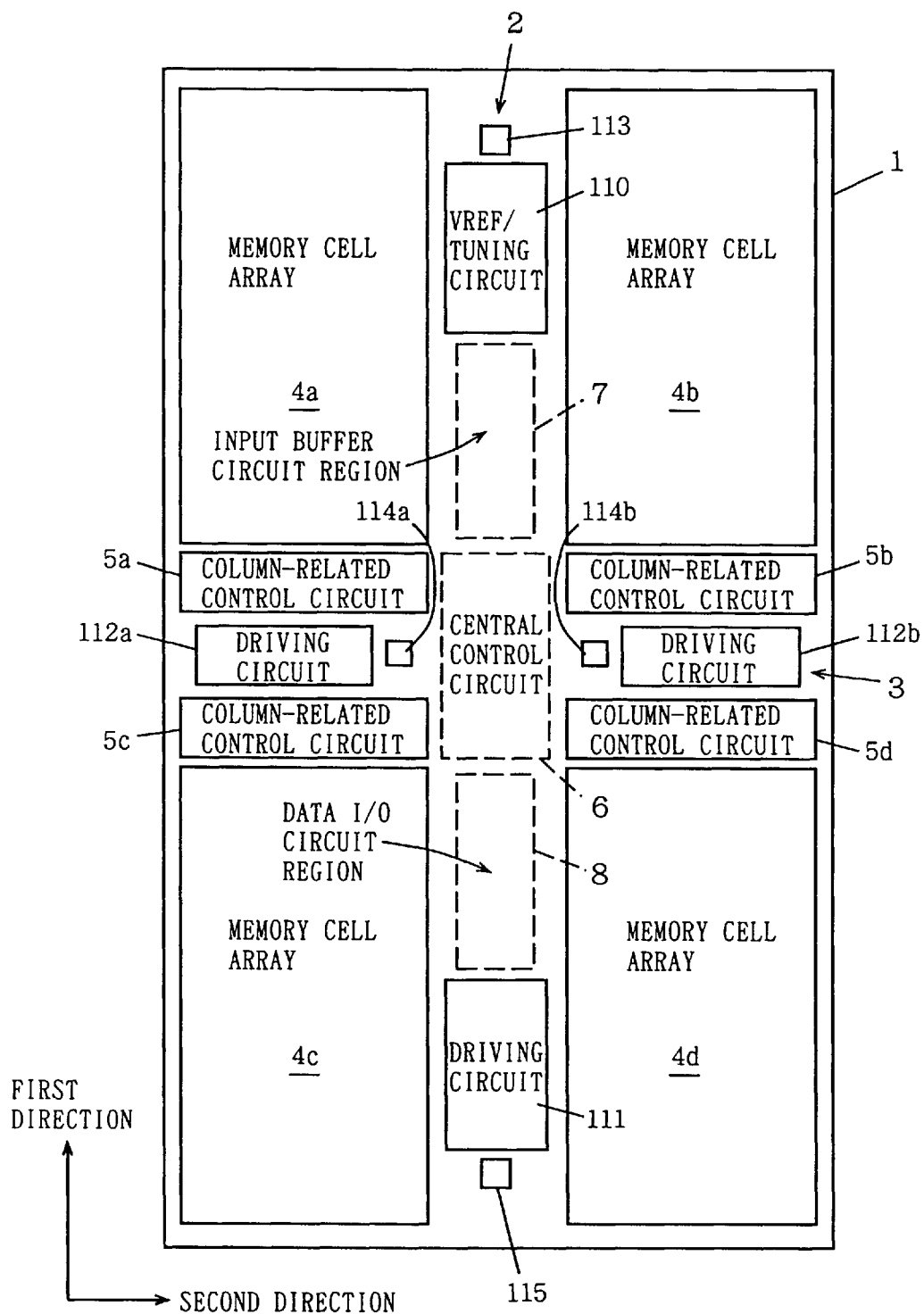
FIG. 9 is a schematic diagram showing the whole layout of a semiconductor device in accordance with the second embodiment of the invention.

FIG. 9 schematically shows the overall layout of a semiconductor device in accordance with the second embodiment of the invention. In FIG. 9, memory cell arrays 4a, 4b, 4c and 4d are respectively located in the four regions divided by a first central region 2 and a second central region 3 on a semiconductor chip 1, as in the case of the first embodiment. In addition, column-related control circuits 5a, 5b, 5c and 5d are located corresponding to memory cell arrays 4a, 4b, 4c and 4d. Furthermore, a central control circuit 6 is located in the middle of first central region 2, and an input buffer circuit region 7 and a data I/O circuit region 8 are located adjacent to central control circuit 6. The above-described structure is the same as that of the first embodiment.

According to the second embodiment, in the periphery of first central region 2, a reference voltage (VREF) and tuning circuit region 110 is provided adjacent to input buffer circuit region 7. Tuning circuit 106 and reference voltage generating circuit 90 shown in FIG. 8 are located within region 110.

A driving circuit region 112a including the driving circuit shown in FIG. 7 is provided in the region between column-related control circuits 5a and 5c. A driving circuit region 112b is provided in the region between column-related control circuits 5b and 5d. In addition, in first central region 2, a driving circuit region 111 is located in the region which is opposite to VREF/tuning circuit region 110 with respect to central control circuit region 6.

A power supply pad 114a receiving an external power supply voltage is located between driving circuit region 112a and central control circuit 6, and a power supply pad 114b receiving an external power supply voltage is located between driving circuit region 112b and central control circuit region 6. A power supply pad 113 receiving an external power supply voltage is located adjacent to VREF/tuning circuit region 110 between region 110 and one chip end, and a power supply pad 115 receiving an external power supply voltage is located between driving circuit region 111 and another chip end. This power supply pad arrangement is similar to that of the first embodiment and has effects similar to those of the first embodiment.

In the arrangement shown in FIG. 9, the driving circuit in driving circuit region 112a supplies an internal power supply voltage to column-related control circuits 5a and 5c, while the driving circuit in driving circuit region 112b supplies an internal power supply voltage to column-related control circuits 5b and 5d. The driving circuit in driving circuit region 111 supplies an internal power supply voltage to the data I/O circuit in data I/O circuit region 8.

Reference voltage generating circuit (VREF) 90 in VREF/tuning circuit region 110 commonly supplies a reference voltage to the driving circuits respectively included in driving circuit regions 112a, 112b and 111. In addition, the tuning circuit in VREF/tuning circuit region 110 commonly transmits a control signal to the driving circuits in driving circuit regions 112a, 112b and 111. The control signal is a binary signal and has its level being fixed, and therefore will not be affected even when transmitted over a long distance, thereby accurately setting the shift amount of each level shifting circuit.

A portion common to the plurality of driving circuits is located in one peripheral portion. Thus, an occupied area of the dispersedly located internal down-converting circuits can be reduced. In particular, the reference voltage generating circuit and the tuning circuit which require a large area are located in peripheral region 110 having enough space, whereby efficient arrangement thereof can be achieved without adversely affecting the layout of other circuits in the semiconductor device. In addition, as in the case of the first embodiment, the circuits are located not intensively in the central portion but dispersely, whereby an area of the central portion will not increase as well as the chip size will not increase.

In addition, each driving circuit only includes an internal voltage adjusting circuit and a level shifting circuit and therefore has a small occupied area, whereby it can be placed, with enough space, within second central region 3. In addition, power supply pads 114a, 114b and 115 are located adjacent to the respective driving circuits, whereby an internal power supply voltage can be stably supplied to a corresponding circuit, as in the case of the first embodiment.

Figure 10:
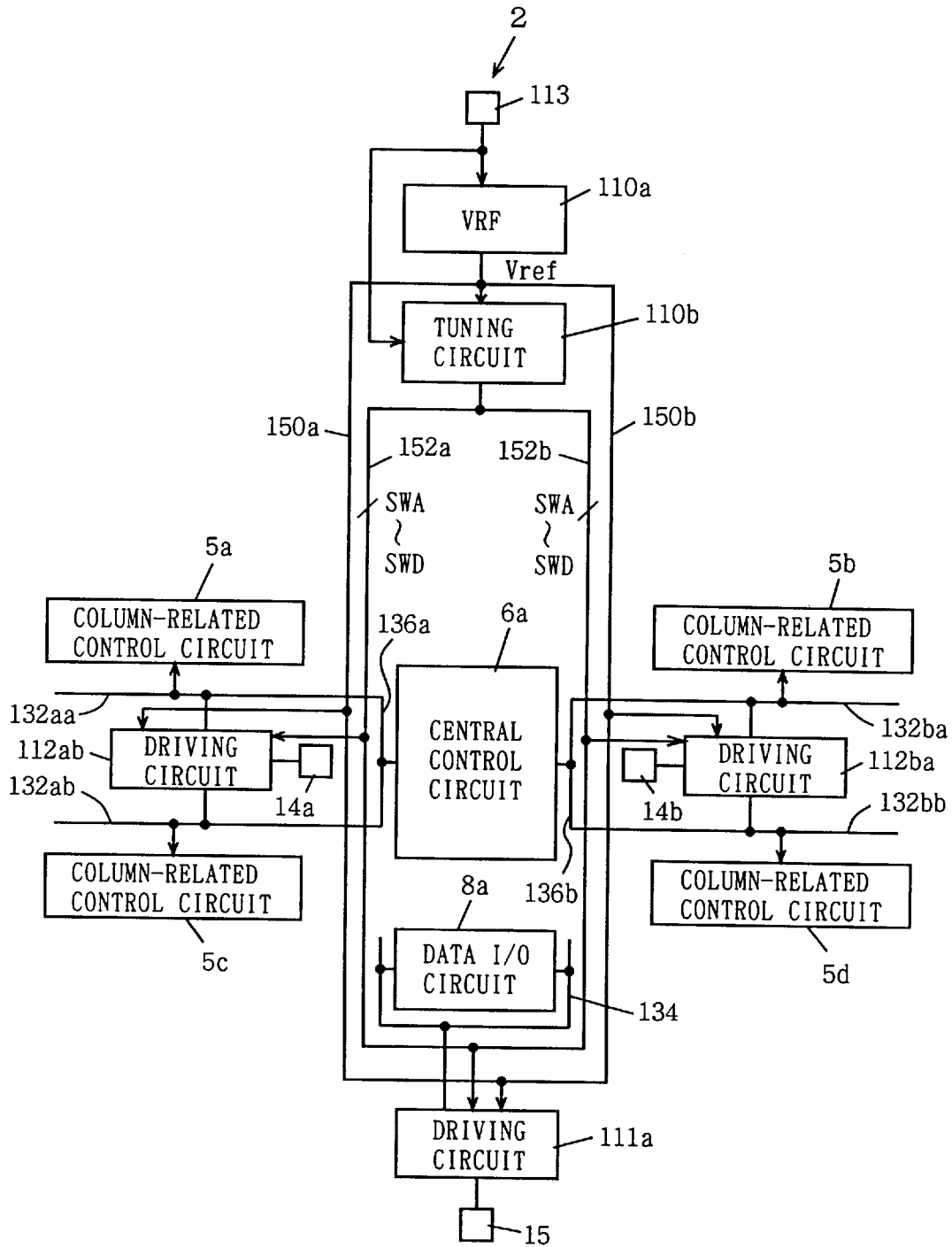
FIG. 10 is a schematic diagram showing an interconnection layout in the second embodiment of the invention.
Figure 11:
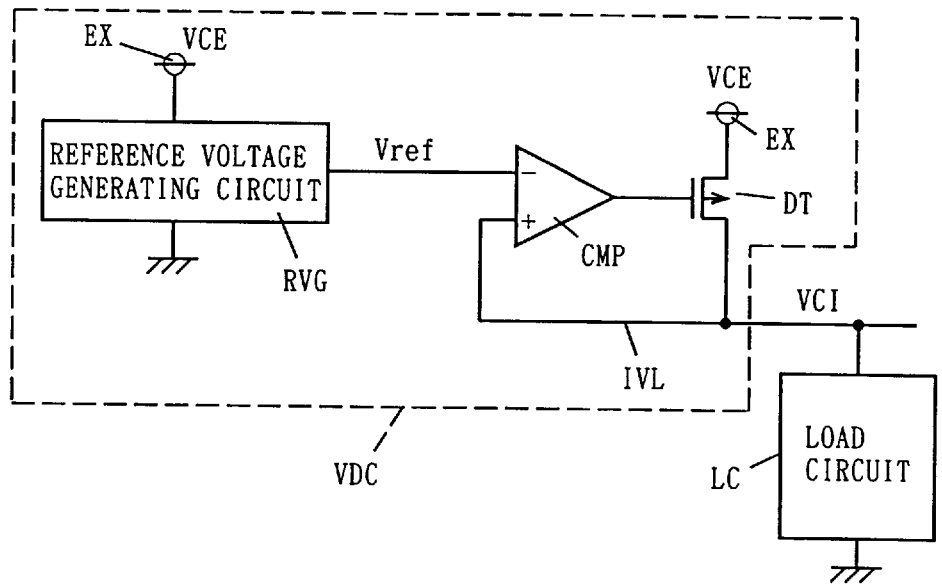
FIG. 11 is a schematic diagram showing the structure of a conventional internal down-converting circuit.
Figure 12:
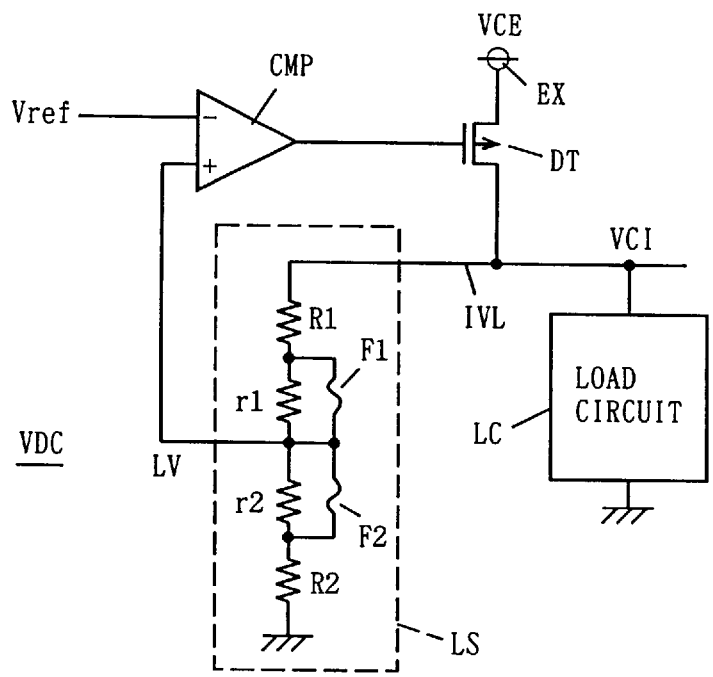
FIG. 12 is a schematic diagram showing the structure of a modification of the conventional internal down-converting circuit.

FIG. 10 schematically shows the interconnection layout of the semiconductor device in accordance with the second embodiment. In FIG. 10, an internal power supply line 132aa is located for column-related control circuit 5a, and an internal power supply line 132ab is located for column-related control circuit 5c. These internal power supply lines 132aa and 132ab are connected to each other through an internal power supply line 136a. An internal power supply voltage from driving circuit 112ab included in driving circuit region 112a is supplied to these internal power supply lines 132aa, 136a and 132ab.

An internal power supply line 132ba is located for column-related control circuit 5b, and an internal power supply line 132bb is located for column-related control circuit 5d. These internal power supply lines 132ba and 132bb are connected to each other through an internal power supply line 136b. An internal power supply voltage from driving circuit 112ba included in driving circuit region 112b is supplied to these internal power supply lines 132ba, 132bb and 136b.

Central control circuit 6a included in central control circuit region 6 uses a power supply voltage on internal power supply lines 136a and 136b.

Data I/O circuit 8a included in data I/O circuit region 8 operates with a power supply voltage on an internal power supply line 134 as one operating power supply voltage. An internal power supply voltage from driving circuit 111a included in driving circuit region 111 is supplied to internal power supply line 134.

A reference voltage Vref from reference voltage generating circuit (VREF) 110a included in peripheral region 110 of first central region 2 is transmitted through internal interconnection lines 150b. Reference voltage Vref on internal interconnection line 150a is supplied to driving circuit 112ab. Reference voltage Vref on internal interconnection 150b is supplied to driving circuit 112ba. Reference voltage Vref from internal interconnection lines 150a and 150b is applied to driving circuit 111a.

Furthermore, control signals SWA to SWD from a tuning circuit 110b included in region 110 are supplied to driving circuit 112ab through internal interconnection line 152a and to driving circuit 112ba through internal interconnection line 152b. Control signals SWA to SWD are transmitted to driving circuit 111a through internal interconnection lines 152a and 152b. The internal power supply lines are provided separately for each circuit region, whereby noise propagation between these internal power supply lines can be surely prevented. In particular, power supply pads 14a, 14b and 15 are respectively provided near the driving circuits, which in turn can stably supply a current from the respective power supply pads to corresponding internal power supply lines.

In addition, reference voltage Vref is transmitted through the internal interconnection line arranged in a loop, but the reference voltage Vref is at a fixed voltage level and no quick response characteristic is required. Therefore, even if reference voltage Vref is transmitted from the peripheral portion of first central region 2 to driving circuits 112ab and 112ba over a relatively long distance it will not cause any problem (an input stage of the comparator is the gate of the MOS transistor, causing no current consumption). The reference voltage is supplied to driving circuit 111a through internal interconnection lines 150a and 150b. The reference voltage is supplied through the transmission paths to the circuitry located far away, whereby the reference voltage can be stably supplied to driving circuit 111a. As to control signals SWA to SWD, advantages similar to those of the reference voltage can be obtained.

As has been described above, according to the second embodiment, the reference voltage generating circuit and the tuning circuit which require a relatively large area are located in the peripheral portion having enough space, and each driving circuit actually generating an internal power supply voltage is provided near corresponding circuitry consuming current, whereby the internal power supply circuitry can be provided without increase in area resulting from arrangement thereof.

In addition, since the power supply pads are respectively located near the driving circuits, each driving circuit can supply a current from a corresponding power supply pad to a corresponding internal power supply line, whereby reduction in internal power supply voltage can be compensated for. Furthermore, the distance from the power supply pads to the circuitry consuming current is reduced and therefore voltage drop due to interconnection line resistance of the internal power supply lines can be suppressed.

Note that combination of the first and second embodiments is also possible. More specifically, the driving circuits are selectively activated in response to an activation indication signal and a current path in level shifting circuit 102 is cut off in accordance with the activation indication signal. When such a driving circuit that is activated only during an active cycle is used, an active driving circuit is provided in each driving circuit region of FIG. 9. In addition, a reference voltage generating circuit, a tuning circuit and a standby driving circuit which is activated during a standby cycle are provided in region 110.

The internal down-converting circuitry for down-converting an external power supply voltage to produce an internal power supply voltage has been described in the first and second embodiments. The present invention, however, can be applied to the structure in which the external power supply voltage is converted into another voltage which in turn is used in the internal circuitry, as long as the voltage converting circuitry has the same structure as that of the internal down-converting circuit.

Furthermore, the semiconductor device in the present invention is not limited to a dynamic random access memory (DRAM) and may be any device as long as it includes internal down-converting circuitry. In addition, the present invention can be applied to any semiconductor device as long as the device includes voltage converting circuitry having a structure similar to that of the internal down-converting circuitry.

As has been described above, in accordance with the present invention either, the reference voltage generating circuit and the standby down-converting circuit or the reference voltage generating circuit and the tuning circuit are located in the peripheral portion having relatively enough space and the active down-converting circuitry or the driving circuitry which actually supplies a current and produces an internal voltage are located near corresponding circuitry having current consumption. Therefore, the internal power supply voltage generating circuitry can be efficiently arranged without increase in chip area and bad influence on the interconnection layout of other circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a standby cycle and an active cycle as an operation cycle, comprising:

a standby down-converting circuit located in a periphery of a region where said semiconductor device is placed on a chip, for down-converting an external power supply voltage to produce an internal power supply voltage on an internal power supply line during said standby cycle and active cycle; and at least one active down-converting circuit located in a region different from the region where said standby down-converting circuit is located, with a function circuit interposed therebetween on said chip, for down-converting said external power supply voltage to produce said internal power supply voltage on said internal power supply line when activated in said active cycle.

2. The semiconductor device as recited in claim 1, further comprising:

a central control circuit located in a vicinity of said active down-converting circuit, operating with the internal power supply voltage from said active down-converting circuit and said standby down-converting circuit as one operating power supply voltage during said active cycle, and responsive to an externally applied control signal for producing an internal control signal.

3. The semiconductor device as recited in claim 1, further comprising:

a memory array having a plurality of memory cells arranged in rows and columns; and a column-related control circuit responsive to an externally applied control signal for controlling an operation relating to selection of a memory cell column of said memory array, said column-related control circuit being located in a vicinity of said active down-converting circuit and operating with the internal power supply voltage on said internal power supply line as one operating power supply voltage.

4. The semiconductor device as recited in claim 1, further comprising:

a reference voltage generating circuit located in said periphery for producing a reference voltage, wherein each of said active down-converting circuit and said standby down-converting circuit includes an internal voltage adjusting circuit for comparing a voltage corresponding to the internal power supply voltage on said internal power supply line with said reference voltage and supplying a current from a node receiving said external power supply voltage to said internal power supply line in accordance with the comparison result.

5. The semiconductor device as recited in claim 1, wherein the region where said semiconductor device is located is divided into four regions by both a first central region extending in a first direction and located in a center of the chip with respect to a second direction perpendicular to said first direction and a second central region extending in said second direction and located in a center with respect to said first direction, said standby down-converting circuit is located in a periphery of said first central region, and said active down-converting circuit is located at least in said second central region.

6. The semiconductor device as recited in claim 5, wherein said at least one active down-converting circuit includes an active down-converting circuit located in a region of said first central region which is opposite to said periphery with respect to said second central region.

7. The semiconductor device as recited in claim 1, further comprising:

a power supply pad provided corresponding to the standby and active down-converting circuits and located in a vicinity of corresponding one of said standby down-converting circuit and said active down-converting circuit, for receiving said external power supply voltage and supplying the received voltage to the corresponding down-converting circuit.

8. A semiconductor device formed on a chip, comprising:

a reference voltage generating circuit located in a first region of a periphery of a region where said 5 semiconductor device is located on said chip, for generating a reference voltage; and a plurality of driving circuits each located in a second region different from said first region for producing an internal power supply voltage on a corresponding internal power supply line, each of said driving circuits including (i) a variable level shifting circuit capable of adjusting a level shift amount of a voltage on a corresponding internal power supply line, and (ii) an internal voltage adjusting circuit for comparing an output voltage of said variable level shifting circuit with the reference voltage from said reference voltage generating circuit and supplying a current from an external power supply voltage application node to a corresponding internal power supply line in accordance with the comparison result;

a tuning circuit located in said first region and coupled in common to each of said plurality of driving circuits for setting a level shift amount of each said variable level shifting circuit of said plurality of driving circuits.

9. The semiconductor device as recited in claim 8, wherein each of said variable level shifting circuits includes a resistance circuit for reducing a voltage on a corresponding internal power supply line by shifting the voltage in level by a resistive element having an adjustable resistance value, and said tuning circuit includes a fuse programmable circuit for generating a signal for adjusting a resistance value of the resistive element of each said resistance circuit by blowing a fuse element.

10. The semiconductor device as recited in claim 8, wherein said chip is divided into four regions by both a first central region extending in a first direction and located in a middle of the chip with respect to a second direction and a second central region extending in said second direction and located in a middle of the chip with respect to said first direction, wherein said first region is located in a periphery of said first central region, and said driving circuits are located at least in said second central region.

11. The semiconductor device as recited in claim 8, further including, external power supply pads coupled to a node receiving said external power supply voltage and corresponding to said driving circuits and located in a vicinity of corresponding driving circuits.

12. The semiconductor device as recited in claim 10, wherein said plurality of driving circuits include a driving circuit located in a region of said first central region which is opposite to said first region with respect to said second central region.

13. A semiconductor memory device formed on a chip, comprising:

a first region extending in a first direction and arranged on a center portion of said chip with respect to a second direction perpendicular to said first direction, a second region extending in the second direction and arrange on a center portion of said chip with respect to the first direction;

said first region and said second region dividing said chip into four sub regions, a plurality of memory arrays each including a plurality of memory cells arranged in rows and columns, the memory arrays arranged corresponding to said four sub regions respectively;

a plurality of control circuits provided corresponding to said plurality of memory arrays, for performing an operation related to at least column selection in corresponding memory arrays;

a reference voltage generator provided in a periphery of said first region for generating a reference voltage at a predetermined voltage level;

internal voltage generators provided in said second region and corresponding to the memory arrays, for receiving said reference voltage and an external voltage externally applied to convert the received external voltage into an internal voltage at the reference voltage level for application to the corresponding control circuits.

14. The semiconductor device as recited in claim 13, further comprising:

a standby internal voltage generator provided in said periphery and adjacent to said reference voltage generator, for receiving the external voltage and said reference voltage to convert said external voltage into a voltage at the reference voltage level for application to the respective control circuits, said internal voltage generators being activated to produce said internal voltage when said control circuits are made active.

15. The semiconductor device as recited in claim, 14, further comprising:

a main control circuit arranged at a crossing of said first region and said second region, for receiving external signals to produce internal signals for application to said control circuits, an interconnection line arranged in a loop form in said first region to include said main control circuit, for transferring said internal voltage from said standby internal voltage generator, sub interconnection lines provided corresponding to said control circuits and coupled to said interconnection line and also coupled to receive the internal voltage from corresponding internal voltage generators.

16. The semiconductor device as recited in claim 15, further comprising, data input/output circuit arranged opposite to said periphery in said first region with respect to said second region, for inputting and outputting data to and from the memory arrays, a further internal voltage generator provided corresponding to said data input/output circuit and receiving said reference voltage and the external voltage to convert the external voltage to a voltage at the reference voltage level for application to said data input/output circuit through said interconnection line.

17. The semiconductor device as recited in claim 13, further comprising, a first standby internal voltage generator provided in said periphery and receiving said reference voltage and the external voltage for converting the external voltage into a voltage at the reference voltage level for transmission through a first internal interconnection line extending in said first region a second standby internal voltage generator provided in said periphery and receiving said reference voltage and the external voltage for converting the external voltage into a voltage at the reference voltage level for transmission through a second internal interconnection line extending in said first region separatedly from said first internal interconnection line, a first sub interconnection line provided in said second region at one side with respect to said first region and coupled to said first internal interconnection line and also coupled to receive the internal voltage from the corresponding internal voltage generator for application to the corresponding control circuit, a second sub interconnection line provided in said second region at another side with respect to said first region and coupled to said second internal interconnection line and also coupled to receive the internal voltage from the corresponding internal voltage generator for application to the corresponding control circuit.

18. The semiconductor device as recited in claim 17, further comprising a data input/output means for communicating data with the memory arrays, arranged in the first region and opposing to said periphery with respect to the second region, a third internal interconnection line arranged in said first region in a loop and coupled to the first and second internal voltage generators for transmitting the internal voltage to said data input/output circuit, and an active internal voltage generator coupled to receive said reference voltage and the external voltage to convert the external voltage into a voltage at the reference voltage level for application to said data input/output circuit through said third interconnection line, said reference voltage being transmitted to the respective internal voltage generators through a conductor line in a loop form in said first region.

19. The semiconductor device as recited in claim 13, wherein said internal voltage generators each include a variable level shifter for level shifting the generated internal voltage, an amount of the level shift being variable, and wherein said semiconductor device further includes a level control circuit arranged in said periphery and generating a control signal determining the amount of the level shift for application to the respective internal voltage generators.

20. The semiconductor device as recited in claim 19, further comprising a data input/output circuit arranged in said first region opposite to the periphery with respect to said second region, for communicating data with the memory arrays, a drive internal voltage generator provided in said first region adjacent to said data input/output circuit and receiving said reference voltage from said reference voltage generator and the external voltage to convert the external voltage to a voltage at the reference voltage level for application to said data input/output circuit, said drive internal voltage generator including a level shifter for level shifting the generated internal voltage for comparison with the reference voltage, an amount of said level-shift determined by said control signal received through a loop form conductor line from said level control circuit.

* * * * *